United States Patent [19]
LaBelle, Jr.

[11] 3,953,174
[45] Apr. 27, 1976

[54] APPARATUS FOR GROWING CRYSTALLINE BODIES FROM THE MELT

[75] Inventor: Harold E. LaBelle, Jr., Hanover, Mass.

[73] Assignee: Tyco Laboratories, Inc., Waltham, Mass.

[22] Filed: Mar. 17, 1975

[21] Appl. No.: 558,768

[52] U.S. Cl. ............................. 23/273 SP; 156/608; 156/617; 164/129
[51] Int. Cl.² ........................................ B01J 17/18
[58] Field of Search ................. 23/273 SP; 156/608, 156/616, 617; 164/129, 85, 274

[56] References Cited
UNITED STATES PATENTS

| | | |
|---|---|---|
| 3,591,348 | 7/1971 | LaBelle, Jr. ........................ 156/608 |
| 3,687,633 | 8/1972 | LaBelle, Jr. et al. ............... 156/608 |

*Primary Examiner*—Norman Yudkoff
*Assistant Examiner*—Curtis P. Ribando
*Attorney, Agent, or Firm*—Schiller & Pandiscio

[57] ABSTRACT

The invention is an improved apparatus for use in a system for growing crystalline bodies from the melt. The apparatus has a novel crucible die assembly in which the dies are located in cavities in the crucible side wall.

6 Claims, 4 Drawing Figures

APPARATUS FOR GROWING CRYSTALLINE BODIES FROM THE MELT

This invention relates to apparatus for growing crystalline bodies from the melt and more particularly to dies for growing crystals according to the EFG process.

Various systems have been developed for growing monocrystalline bodies from a melt. The present invention pertains to an improvement in growing crystalline bodies from a melt according to what is called the edge-defined, film-fed, growth technique (also known as the EFG process). Details of the EFG process are described in my earlier U.S. Pat. No. 3,591,348 issued July 6, 1971 for METHOD OF GROWING CRYSTALLINE MATERIALS.

In the EFG process the shape of the crystalline body is determined by the external or edge configuration of the end surface of a forming member which for want of a better name is called a die. An advantage of the process is that bodies of selected shapes such as round tubes or flat ribbons can be produced commencing with the simplest of seed crystal geometries, namely, a round small diameter seed crystal. The process involves growth on a seed from a liquid film of feed material sandwiched between the growing body and the end surface of the die, with the liquid in the film being continuously replenished from a suitable melt reservoir via one or more capillaries in the die member. Among the materials that have been grown by the EFG process as monocrystalline bodies are α-alumina, spinel, chrysoberyl, barium titanate, lithium niobate, yttrium aluminum garnet and silicon.

An essential requirement of the EFG process is that the crucible and die member be made of a composition that will withstand the operating temperatures and will not react with the melt. Also the die member must be wettable by the melt. Thus in growing monocrystalline alumina or sapphire bodies, the dies and crucibles are usually made of molybdenum although tungsten and iridium also may be used. It is also desirable that the dies and crucibles be made of a material that will not dissolve in the melt. However, in at least some instances the die and/or crucible materials have a small but finite solubility in the melt and, therefore, the longer the crystal growing process proceeds without interruption, the more likely that die and/or crucible material will dissolve in the melt and thereby affect either the growth process or the quality of the crystalline body that is produced. Although the solution of molybdenum in molten alumina is relatively small, it has been observed that molybdenum will tend to dissolve off of the crucible and precipitate onto the die member so as to close off or clog the capillaries or adhere to the end surface of the die, with the result that the growth process must be interrupted and the die member replaced. Molybdenum, tungstem and iridium are expensive and difficult to machine and hence a shutdown involves a substantial part replacement cost as well as loss of production. Additionally, the dissolved crucible material may be carried over into the growing crystal with the result the product may be of an inferior quality.

The primary object of the present invention is thus to provide an improved apparatus for growing crystalline bodies from the melt by the EFG process.

Another object is to provide a new and improved crucible-die assembly for growing crystalline bodies by the EFG process, and having increased die life.

Still another object is to provide a novel die-crucible assembly for growing crystalline bodies from a melt by the EFG process whereby the rate of dissolution of crucible material into the melt is reduced as compared with prior die-crucible assemblies.

Described briefly, the invention is based on the realization that the aforesaid problem of capillary clogging is caused by a temperature dependent dissolution phenomena. Heretofore existing EFG systems typically comprise a crucible-die assembly in which the die is disposed in the interior of the crucible in contact with the melt. A furnace surrounds the assembly and supplies heat to the assembly at the crucible walls. With this well-known arrangement the interior surfaces of the crucible walls are at a temperature somewhat above that of the die member. This presents a problem since the solubility of the crucible material in the melt increases with the melt temperature. As a result, crucible material tends to dissolve from the crucible walls only to precipitate on surfaces of the cooler die member. The present invention provides a system for supplying heat to a crucible-die assembly so that the temperature of the die member is somewhat higher than the surfaces of the crucible which contact the melt. Accordingly, the present invention, whereby the foregoing objects are achieved, comprises a crucible and die assembly in which the die members are located in the side wall of the crucible. More specifically, the crucible is open at its top end and comprises a bottom wall and a vertical side wall defining an interior space for containing a quantity of melt. The side wall is provided with one or more holes or cavities for receiving a like plurality of die assemblies. One or more passageways are provided in the crucible side wall for connecting the bottom ends of the holes or cavities to the crucible interior space so that melt can flow from the crucible interior space into the capillaries of the dies.

Other features and many of the attendant advantages of this invention are set forth or rendered obvious by the following detailed description which is to be considered together with the accompanying drawings wherein.

The present invention may be used to produce monocrystalline bodies in a variety of shapes and made of any one of a variety of congruently melting materials that solidify in identifiable crystal lattices. By way of example, the material may be alumina, barium titanate, lithium niobate or yttrium aluminum garnet, and silicon. The invention is also applicable to growth of other materials such as eutectic compositions. The following detailed description of the invention is directed to growing tubes of sapphire, i.e., monocrystalline alphaalumina, although it is not intended that the invention be so limited.

Figure 1:
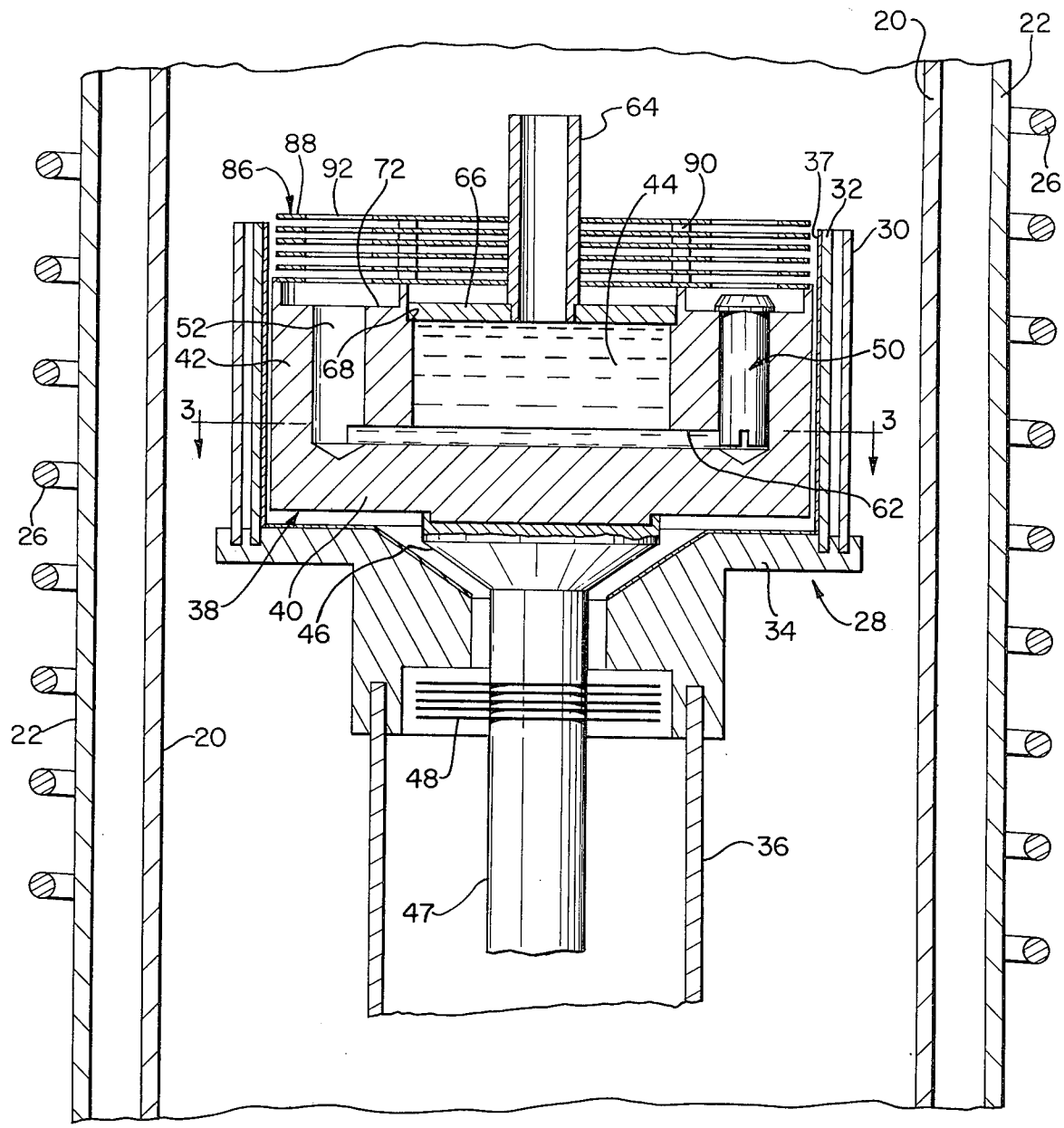
FIG. 1 is a fragmentary side elevational view, partly in section of one form of apparatus that may be employed in the practice of the invention.

FIG. 1 shows a preferred form of crucible-die assembly constructed in accordance with the present invention installed in a stationary enclosure which forms part of a crystal growing furnace of the type shown in FIG. 1 of U.S. Pat. No. 3,591,348. FIG. 1 shows only part of the furnace enclosure which comprises two concentric-spaced quartz tubes 20 and 22 whose opposite ends are supported in a known manner so that the annular space between the two tubes forms a chamber through which a coolant is circulated. The furnace enclosure is surrounded by an induction heating coil 26 that is coupled to a controllable 10 kc. power supply (not shown) of conventional construction. The heating coil may be moved up and down along the length of the furnace enclosure and means (not shown) are provided for supporting the coil at a selected elevation.

Located within the furnace enclosure is a cylindrical heat susceptor 28 consisting of two concentric spaced tubes 30 and 32 and a base member 34. Tubes 30 and 32 are supported by and interlocked with base member 34. The foregoing parts of the heat susceptor are all made of graphite. The susceptor is open at its top end and base member 34 is secured to and supported by an alumina tube 36 which in turn is anchored in the furnace base (not shown). Lining the interior of the susceptor is a thin (e.g. 0.010 inch thick) tungsten sheet 37. Disposed within susceptor 28 is a cylindrical crucible 38. The crucible comprises a bottom wall 40 and a side wall 42 defining an interior space for containing a melt 44 of the material to be grown in accordance with the invention, i.e. alumina. The crucible is mounted on a support member 46 which is attached to a molybdenum rod 47 whose bottom end is anchored to the furnace base (not shown). The crucible is typically made of molybdenum. It is held by support member 46 is spaced relation to the susceptor since there is a eutectic reaction between graphite and molybdenum at about 2200°C. To prevent loss of heat out of the lower end of the susceptor a plurality of spaced radiation shields 48 made of molybdenum are mounted to rod 47 as shown.

Figure 2:
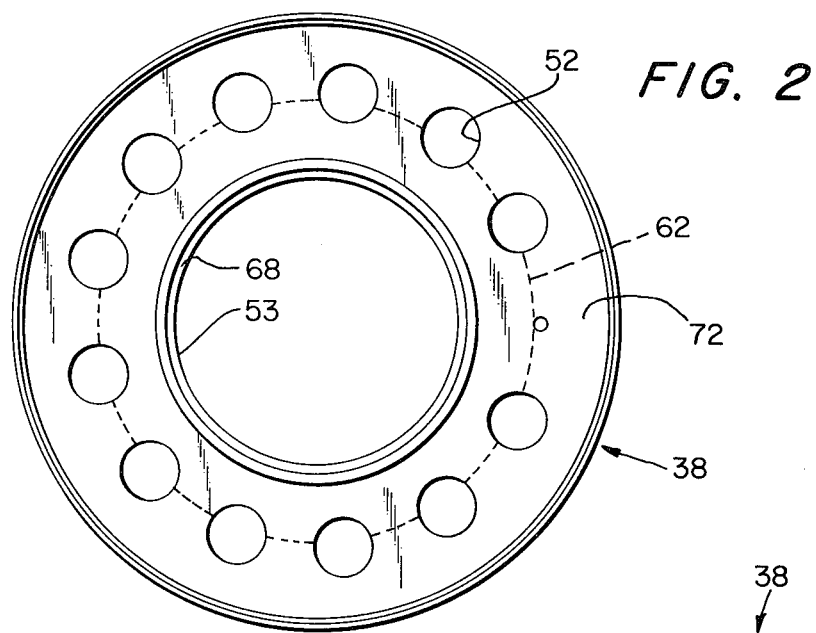
FIG. 2 is a top plan view of the crucible portion of the apparatus of FIG. 1.
Figure 3:
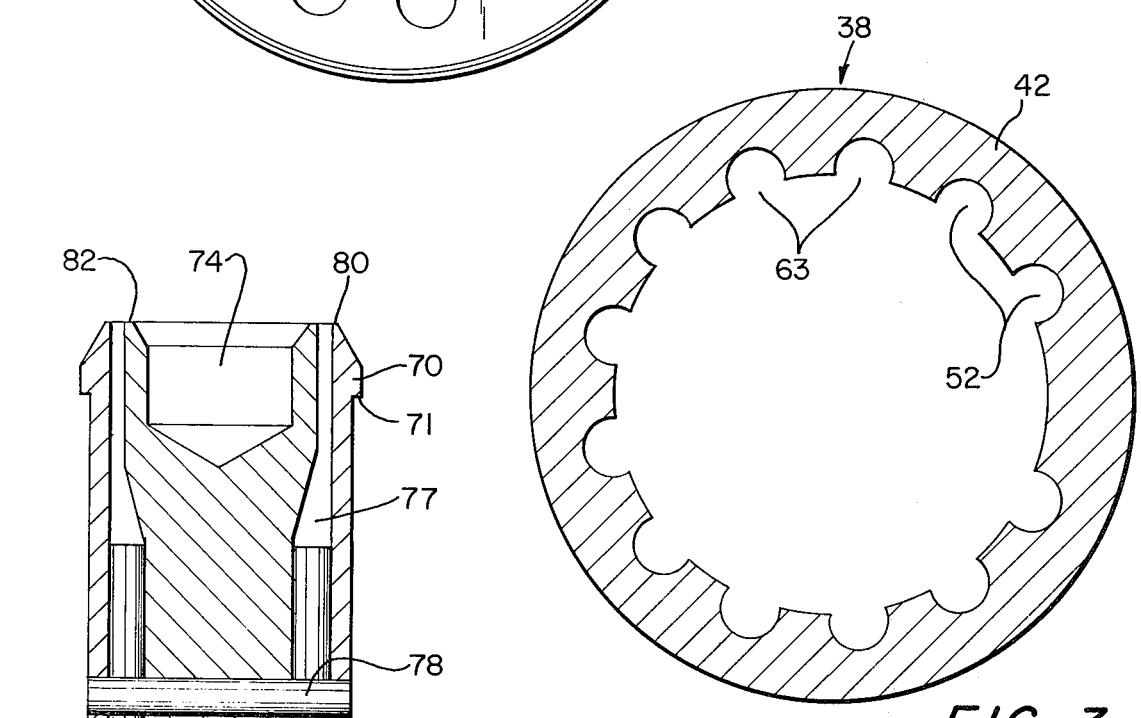
FIG. 3 is a cross-sectional view of the crucible portion of the same apparatus taken along line 3—3 in FIG. 1.

Referring now to FIGS. 1–3, the crucible wall 42 has a plurality of holes or cavities 52, each of suitable size and shape for receiving a die assembly identified generally by the numeral 50. Cavities 52 form a circular array concentric with the inner surface of the crucible's side wall. Still referring to FIGS. 1–3, the inner surface 53 of the crucible's wall is undercut to form a circumferentially extending groove 62 which intersects the bottom ends of cavities 52 so that each of the latter has a side opening 63 communicating with the inner space of the crucible, whereby melt can flow into each of the cavities. The apparatus also includes a molybdenum charge tube 64 for supplying alumina to the interior of the crucible to make-up for the material which is consumed during crystal growth. Tube 64 is affixed to a cover plate 66 which is seated on an annular shoulder 68 formed on the inside of the upper end of crucible wall 42.

Figure 4:
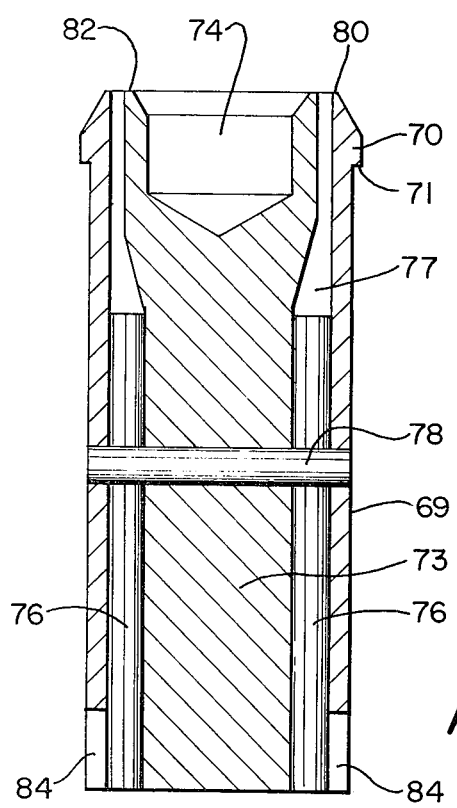
FIG. 4 is an enlarged sectional view in side elevation of one of the die assemblies of the apparatus of FIG. 1.

Referring specifically to FIG. 4, each die assembly 50 is made of molybdenum and comprises a cylindrical sleeve 69 that has an outside flange 70 at its upper end forming an annular shoulder 71. The die assembly is affixed in cavity 52 by a press fit. In either case shoulder 71 engages the flat upper end surface 72 of the crucible and thereby limits the extent to which the die assembly can extend down into a cavity 52. Each die assembly also comprises a center rod 73 of circular cross-section. The upper end of rod 73 has an enlarged outer diameter and is formed with a cavity 74. Center rod 73 is held in spaced concentric relation with sleeve 69 by means of three or more spacer members 76 that consist of small diameter wire and a lock pin 78 that extends transversely through rod 73 and sleeve 69. Sleeve 69, rod 73, spacers 76 and lock pin 78 are all made of molybdenum. The wire spacers 76 are spaced uniformly from one another around the annular space 77 between sleeve 69 and rod 73 and are sized to make a tight fit so that they will not shift position. Use of wire spacers between concentric parts of a die of the character described is well known and is disclosed in U.S. Pat. No. 3,678,633. The radial dimension of annular space 77 between rod 73 and sleeve 69 is small enough for it to function as a capillary whereby alumina melt can rise therein by capillary action. The upper ends of sleeve 69 and rod 73 terminate in flat end surfaces 80 and 82 respectively with the outer diameter of surface 80 and the inner diameter of surface 82 corresponding to the outer and inner diameters of the monocrystalline tubes which are to be grown. Cavity 74 has a diameter sufficiently large so that surface tension will not cause a film of melt on end surface 82 to fill in over it. The length of the annular capillary space 77 is such that molten alumina can rise therein by capillary action up to the upper end of the die assembly and continue to do so as long as the bottom end of the die assembly is submerged in melt material. Preferably as shown the bottom end of sleeve 69 terminates short of the bottom end of cavity 52 so as to leave space for melt to flow into the sleeve. However, if sleeve 66 engages the bottom end of cavity 52, inflow of melt to the capillary may be achieved by forming one or more slots 84 in the bottom end of sleeve 69. Such slots preferably are provided even where the die assembly does not engage the bottom end of the cavity in which it is disposed.

Completing the apparatus shown is an upper radiation shield assembly 86 which consists of one or more annular molybdenum discs 88 that are held together in spaced relation by means of standoff rods 90. This upper shield assembly closely surrounds charge tube 64 and each disc has a plurality of openings 92 that are aligned with cavities 52. Openings 92 serve as apertures through which seed crystals can be brought down into contact with the die assemblies and the growing crystals withdrawn during crystal growth. The seed crystals are moved in unison by a common pulling mechanism (not shown) which is part of the furnace and is adapted to pull the seeds and the growing crystal bodies at a controlled rate.

The apparatus just described is designed to permit simultaneous growth of a plurality of tubular crystal bodies, i.e. tubes that comprise constant inner and outer diameters. Crystal growth may be initiated using a tubular or non-tubular seed. Thus, it is possible to start with an -alumina seed in the form of a monocrystalline filament or ribbon and grow a tube onto the seed in accordance with the EFG technique described in the aforesaid U.S. Pat. No. 3,591,348. Preferably, however, it is preferred to use a monocrystalline tube previously grown by the EFG process. Such tubes are available commercially.

The following example illustrates a preferred mode of practicing the invention.

EXAMPLE

A molybdenum crucible having an internal diameter of about 1.937 inch, a wall thickness of about 1.000 inch, and an internal depth of about 1.020 inch is positioned in the furnace in the manner shown in FIG. 1. The crucible has twelve cavities 52 spaced uniformly in its side wall 42. Cavities 52 each have a diameter of about 0.4062 inch and a length such that each extends slightly below the upper surface of the bottom wall of the crucible, i.e. slightly greater than about 1.020 inch. Cavities 52 communicate with the interior of the crucible via groove 62 which has a height of about 0.093 inch. Disposed in each cavity 52 is a die assembly 50. The sleeve 69 of each die assembly has an outside diameter of about 0.4060 inch except at its shoulder 71 where the outside diameter is 0.437 inch. The length of each die assembly is such that it is spaced slightly (i.e. about 1/16 inch) above the bottom of cavities 52 when the die assemblies are press fitted into cavities 52 to the depth permitted by annular shoulder 71. The capillaries in each die have a width of about 0.059 inch where spacers 76 reside and about 0.028 inch at the top in the region of the enlarged section of rod 73. The radial dimension of surfaces 80 and 82 are each about 0.002 inches. The crucible is charged with substantially pure $\alpha$-alumina and twelve monocrystalline $\alpha$-alumina tubes are grown by drawing the tubes from a film of melt supported in the upper ends of the die assemblies according to the EFG technique. The melt in the crucible is maintained at a surface temperature of about 2070°C. Make-up alumina is continuously added to the crucible via charge tube 64. Once growth has commenced, the pulling speed is held at about 12 inches per hour.

It has been determined that dies disposed as herein described and utilized as in the foregoing example have a useful life of at least about twice that of like dies which are disposed within the interior space of the crucible.

An advantage of the present invention which results from locating the dies in the crucible side walls rather than in the melt reservoir as in the prior art is that the crucible interior space may be made with a smaller diameter than in conventional crucible-die assemblies. As a result the surface area of the side wall of the crucible which is exposed to the melt is reduced, and this in turn results in less dissolution of crucible material per unit time.

Another advantage of the present invention which results from locating the dies in the crucible side walls rather than in the melt reservoir as in the prior art is that now the melt in the die capillaries is at a temperature which is in the order of 15°C higher than the melt in the interior of the crucible. This temperature gradient results from the fact that the heat flows radially inward of the crucible and the dies are closer to the heat source than is the crucible interior space. As a result of this heat gradient precipitation of dissolved crucible material on the capillaries is somewhat reduced, resulting in increased die life.

Still another advantage of the invention is that it is applicable to crucible-die arrangements designed to grow crystalline materials other than alumina, e.g. other congruently and non-congruently melting materials such as aluminum garnet, lithium niobate, silicon and eutectic compositions. With respect to such other materials, the process is essentially the same as that described above for $\alpha$-alumina, except that it requires different operating temperatures because of different melting points and possibly different crucible and die materials in order to avoid reaction with the melt and to assure proper wetting by the melt.

With respect to the die it is to be understood that in the following claims the term "surface" as it pertains to a die member is intended to cover the effective film-supporting surface of that die member. Whether the member is made as a single piece or as two or more pieces, and the term "capillary" is intended to denote a passageway that can take a variety of forms. In this connection it is to be noted that the die assembly of FIG. 4 may be modified so as to consist of two concentric spaced sleeves locked against relative movement and spaced uniformly so as to provide a continuous annular space therebetween that is adapted to function as one large capillary.

Still other die designs may be used, e.g. dies designed for growing flat ribbons or round rods or filaments. The effective film supporting surface of a die member having one or more capillaries is understood to be its entire upper end surface considered as if the capillary or capillaries were not present since when a film of melt fully overlies the end surface it covers over each capillary orifice.

What is claimed is:

1. Apparatus for use in a system for growing crystalline bodies from the melt comprising: a crucible having a side wall and a bottom wall defining an interior space for containing a melt, said side wall having an upper end surface, a plurality of cavities in said side wall extending down from said upper end surface for receiving a like plurality of dies with capillaries, and at least one passageway in said side wall connecting the bottom ends of said cavities with said interior space so that melt can flow from said interior space into said cavities.

2. Apparatus according to claim 1 further including a cover seated on the upper end of said side wall and covering the interior space of the crucible, an opening in said cover, and a charge tube connected to and extending up from said cover, said charge tube communicating with said interior space through said opening.

3. Apparatus according to claim 1 wherein said crucible side wall is substantially cylindrical, and said cavities are substantially circumferentially spaced in said side wall.

4. Apparatus according to claim 1 wherein said at least one passageway extends radially from said interior space to said cavities.

5. Apparatus according to claim 1 further including means exterior of said crucible for heating said crucible and die assembly.

6. Apparatus according to claim 1 further including a capillary die assembly disposed in each of said cavities.

* * * * *